United States Patent
Ting et al.

(10) Patent No.: US 10,988,838 B2
(45) Date of Patent: Apr. 27, 2021

(54) COLOR FILM AND METHOD OF FORMING THE SAME

(71) Applicant: NATIONAL CHENG KUNG UNIVERSITY, Tainan (TW)

(72) Inventors: Jyh-Ming Ting, Taipei (TW); Tun-Yi Chang, Taichung (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 4 days.

(21) Appl. No.: 16/211,247

(22) Filed: Dec. 6, 2018

(65) Prior Publication Data

US 2019/0323115 A1    Oct. 24, 2019

Related U.S. Application Data

(60) Provisional application No. 62/661,098, filed on Apr. 23, 2018.

(51) Int. Cl.
*C23C 14/00* (2006.01)
*C23C 14/06* (2006.01)
*C23C 14/02* (2006.01)

(52) U.S. Cl.
CPC ...... *C23C 14/0015* (2013.01); *C23C 14/0052* (2013.01); *C23C 14/0057* (2013.01); *C23C 14/021* (2013.01); *C23C 14/0676* (2013.01)

(58) Field of Classification Search
None
See application file for complete search history.

(56) References Cited

U.S. PATENT DOCUMENTS

| | | | | |
|---|---|---|---|---|
| 6,468,401 B1* | 10/2002 | Yoshikawa | ......... | C23C 14/0036 204/192.12 |
| 2002/0050051 A1* | 5/2002 | Choi | ....................... | B44C 1/005 29/527.1 |
| 2002/0110700 A1* | 8/2002 | Hein | ..................... | C23C 14/022 428/658 |

OTHER PUBLICATIONS

Biggs. The CIELAB hue wheel [online]. Cached on Feb. 13, 2005, retrieved from http://scanline.ca/hue/cielab.html [cached version retreived from WaybackMachine at web.archive.org] (Year: 2005).*

Feiliang Chen et al, "High performance colored selective absorbers for architecturally integrated solar applications", Journal of Materials Chemistry A, Feb. 25, 2015, pp. 7353-7360, published by Royal Society of Chemistry.

* cited by examiner

*Primary Examiner* — Jose I Hernandez-Kenney
(74) *Attorney, Agent, or Firm* — CKC & Partners Co., LLC

(57) ABSTRACT

The present invention provides a color film and a method of forming the same. In some embodiments, only one titanium target is used, and a flowrate of nitrogen gas, a working pressure, a sputtering power and a sputtering time are adjusted, so as to form single-layered titanium oxynitride color films having different colors and thicknesses. The color film has satisfactory adhesivity, a flat surface and metallic luster.

6 Claims, 15 Drawing Sheets
(6 of 15 Drawing Sheet(s) Filed in Color)

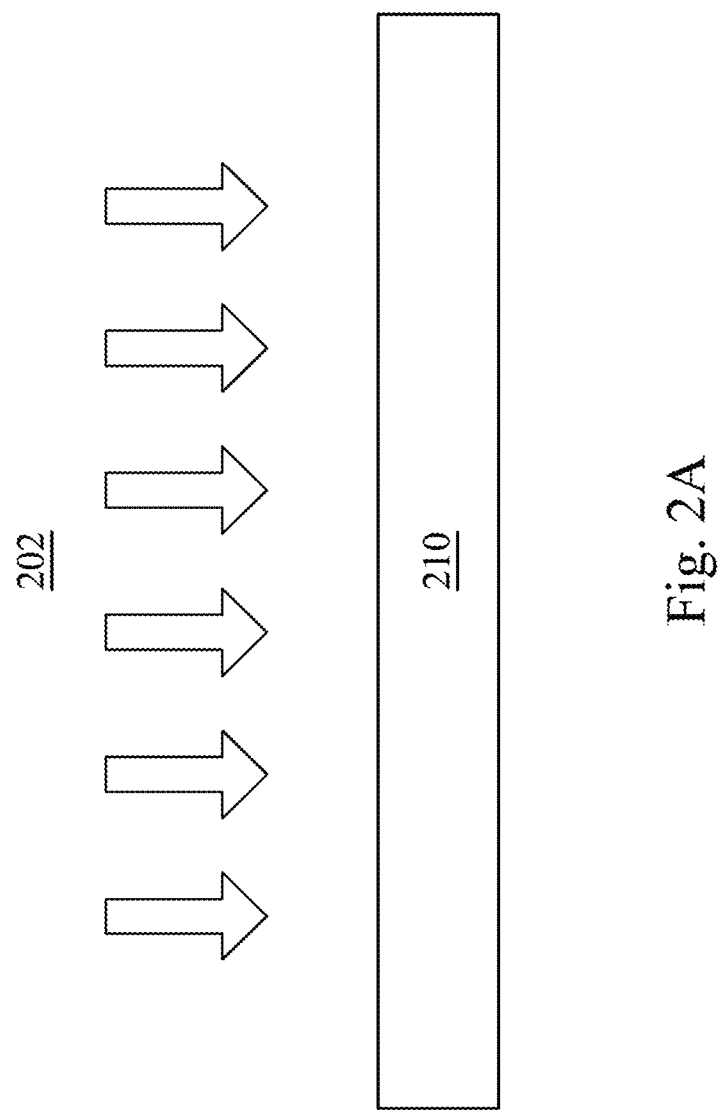

US 10,988,838 B2

COLOR FILM AND METHOD OF FORMING THE SAME

RELATED APPLICATIONS

This application claims priority to U.S. Provisional Application Ser. No. 62/661,098, filed Apr. 23, 2018, which is herein incorporated by reference in its entirety.

BACKGROUND

Field of Invention

The present invention relates to a method of forming a color film. More particularly, the present invention relates to a method of forming a single-layered color film, which is formed by adjusting a sputtering power, a working pressure, a flowrate of nitrogen gas and/or a sputtering time. The formation method further includes controlling the parameters, so as to determine a color of the color film.

Description of Related Art

A film having a decorative color (or a color film) is widely used in various fields, such as a vehicle industry, jewelry, furniture, a constructional material, an electrical device and the like. As the film having the decorative color, satisfactory adhesivity and, preferably, metallic luster are required. The metallic luster is affected by a flatness of a surface of the color film.

A prior art for forming a film is performed by respectively sputtering a stack of a titanium oxynitride film, a titanium dioxide film, a silicon nitride film and a silicon dioxide film over a substrate, such that the film may have a desired color. In this method, a titanium target and a silicon target are required, and oxygen gas, nitrogen gas and a noble gas are respectively introduced, in order to form the stack. Therefore, the cost is higher and the technique is more complicated. In addition, the method does not show how to change the color of the film by adjusting process parameters.

There is another prior art that a color silicon nitride film is deposited on a substrate. In this prior art, only the nitrogen gas is introduced, and the color silicon nitride films having different colors such as golden yellow, blue or purple are obtained according to different flowrates of the nitrogen gas. The prior art discloses that a large amount of the nitrogen gas can change the color of the silicon nitride film from golden yellow to blue or purple, while the large amount of the nitrogen gas may cause a reaction between the nitrogen gas and a surface of the target, leading to an insufficient sputtering efficiency.

A color film and a method of forming the color film are required to tackle the problems, in which a single-layered color film having a predetermined color is formed by adjusting one or more process parameters, and this method can further simplify the typical process. In addition, the color film has satisfactory adhesivity, a flat surface and metallic luster.

SUMMARY

An aspect of the present invention is to provide a method of forming a color film. In some embodiments, the method includes the following operations. First, a metal substrate is provided. Next, a sputtering operation is performed on the metal substrate, so as to form a single-layered titanium oxynitride film having a predetermined color over the metal substrate. The sputtering operation includes bombarding a titanium target with a gas mixture containing a noble gas and a nitrogen gas using a sputtering power of 150 W to 350 W. A volume of the nitrogen gas is 1.5% to 35% of a volume of the gas mixture.

In accordance with some embodiments of the present invention, the sputtering operation is performed for 10 minutes to 40 minutes.

In accordance with some embodiments of the present invention, the sputtering operation is performed under a temperature of 35° C. to 45° C.

In accordance with some embodiments of the present invention, the sputtering operation is performed under a working pressure of 3 mtorr to 5 mtorr.

In accordance with some embodiments of the present invention, the sputtering operation is performed in a reaction chamber, and a back pressure of the reaction chamber is $5 \times 10^{-6}$ torr to $8 \times 10^{-6}$ torr before the sputtering operation is performed.

In accordance with some embodiments of the present invention, when the sputtering power becomes smaller, the predetermined color tends to be a color in a first quadrant and a second quadrant in a CIELAB space.

In accordance with some embodiments of the present invention, when the sputtering power becomes greater, the predetermined color tends to be a color in a third quadrant and a fourth quadrant in a CIELAB space.

The other aspect of the present invention provides a color film formed on a substrate, in which the color film is formed by the above method, and the color film is a single-layered titanium oxynitride film.

In accordance with some embodiments of the present invention, the single-layered titanium oxynitride film has a thickness of 160 nm to 250 nm.

In accordance with some embodiments of the present invention, a molar ratio of nitrogen to oxygen is 0.03 to 0.2.

BRIEF DESCRIPTION OF THE DRAWINGS

The patent or application file contains at least one drawing executed in color. Copies of this patent or patent application publication with color drawing(s) will be provided by Office upon request and payment of the necessary fee. The invention can be more fully understood by reading the following detailed description of the embodiment, with reference made to the accompanying drawings as follows:

FIG. 2A to FIG. 2D are schematic cross-sectional views showing various intermediate stages of a method of forming a color film in accordance with some embodiments of the present invention.

DETAILED DESCRIPTION

One aspect of the present invention is to provide a method of forming a color film. In some embodiments, only one pure titanium target is used in the method, in which a flowrate of nitrogen gas, a working pressure, a sputtering power and a sputtering time are adjusted, so as to change a molar ratio of nitrogen to oxygen of a titanium oxynitride layer, thereby obtaining a single-layered titanium oxynitride ($TiN_xO_y$) color film. Different single-layered titanium oxynitride color films formed by the method may have different predetermined colors and different thicknesses. The color film has satisfactory adhesivity, flat surface and metallic luster.

Figure 1:
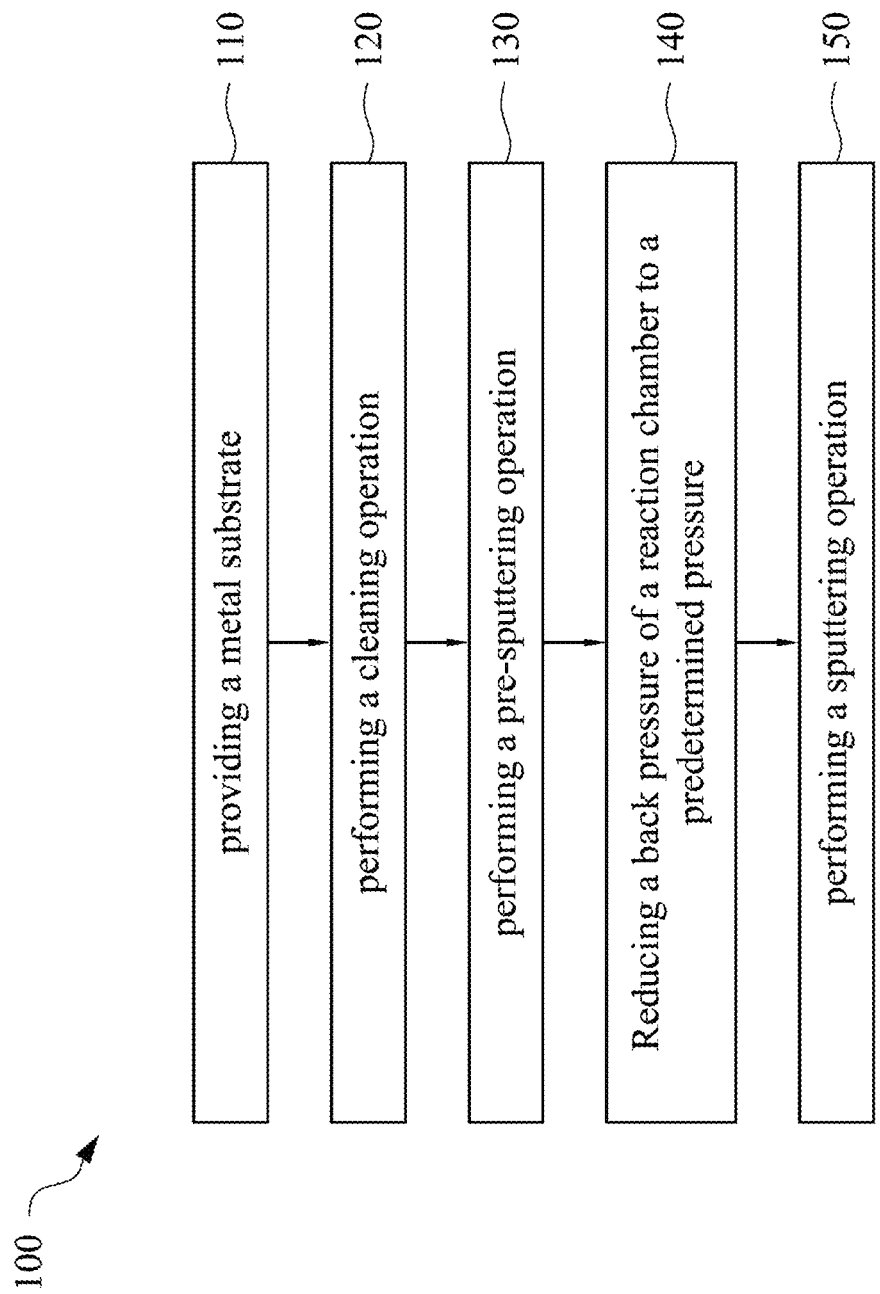
FIG. 1 is a schematic flowchart showing a method of forming a color film in accordance with some embodiments of the present invention.

Please refer to FIG. 1 and FIG. 2A to FIG. 2D. FIG. 1 is a schematic flowchart showing a method of forming a color film in accordance with some embodiments of the present invention. It is noted that other operations may be performed before, during or after operations shown in FIG. 1, and the operations of FIG. 1 can be adjusted or omitted according to requirements. FIG. 2A to FIG. 2D are schematic cross-sectional views showing various intermediate stages of a method of forming a color film in accordance with some embodiments of the present invention.

In an operation 110, a metal substrate 210 is provided, as shown in FIG. 2A. In some embodiments, the metal substrate 210 can be aluminum, stainless steel or titanium. In some embodiments, the metal substrate 210 can be polished in advance, so as to planarize a surface of the metal substrate 210 and improve the metallic luster of the metal substrate 210.

Alternatively, as shown in an operation 120, performing a cleaning operation 202 on the metal substrate 210, as shown in FIG. 2A. In some embodiments, the cleaning operation 202 includes using one or more organic solvents to clean a surface of the metal substrate 210, followed by washing the surface with water and drying the metal substrate 210 by a bake operation. In some examples, the organic solvents may include acetone, ethanol or the like. In one example, acetone is used to remove pollutants on the surface of the metal substrate 210, and the metal substrate 210 is immersed in ethanol to increase hydrophilicity of the surface of the metal substrate 210 in the cleaning operation 202. Then, the metal substrate 210 is washed by water and dried by the bake operation. In some embodiments, the cleaned metal substrate 210 is disposed into a reaction chamber 201.

Alternatively, as shown in an operation 130, a pre-sputtering operation is performed in the reaction chamber 130. In the pre-sputtering operation, a noble gas is introduced into the reaction chamber 201 from a first gas inlet 203, and the noble gas as well as other impurities originally existed in the reaction chamber 201 are removed from a gas outlet 207 by a vacuum pump (not shown) communicated to the gas outlet 207. Therefore, a pollutant source in the reaction chamber 201 is reduced. In some embodiments, the noble gas may be argon.

Alternatively, as shown in an operation 140, a back pressure of the reaction chamber 201 is reduced to a pre-determined pressure by the vacuum pump. In some embodiments, the predetermined pressure of the back pressure is $5 \times 10^{-6}$ torr to $8 \times 10^{-6}$ torr. An oxygen content in the reaction chamber is affected by the back pressure. Because the method of forming the color film of the present invention excludes an operation of introducing oxygen gas, controlling the back pressure is regarded as controlling a molar ratio of nitrogen to oxygen of the titanium oxynitride color film. When the back pressure is greater than $8 \times 10^{-6}$ torr, excess oxygen gas in the reaction chamber 201 causes small molar ratio of nitrogen to oxygen of the titanium oxynitride color film, such that a predetermined color of the titanium oxynitride color film cannot be formed according to the predetermined parameters.

Figure 2B:
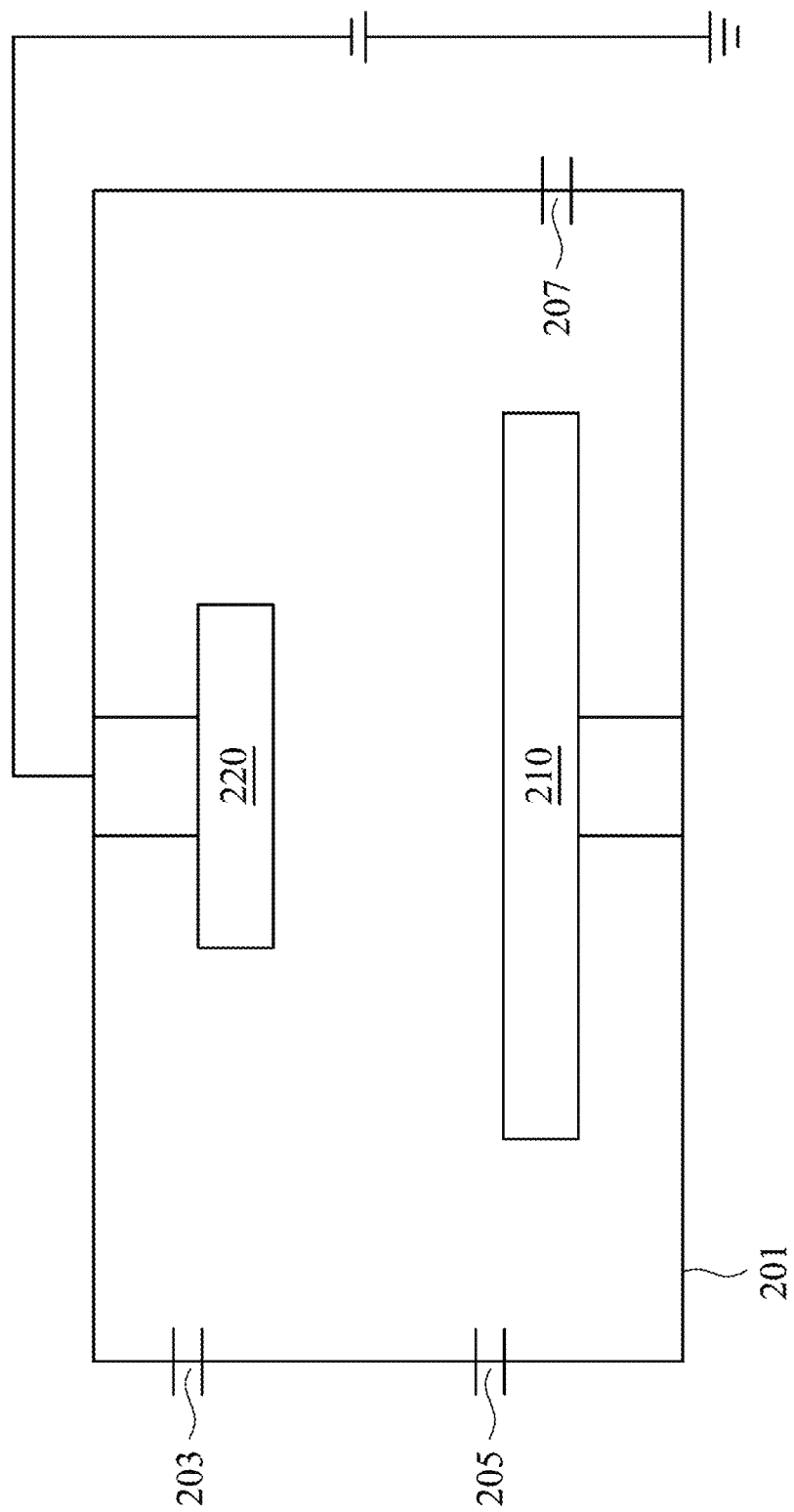
Figure 2C:
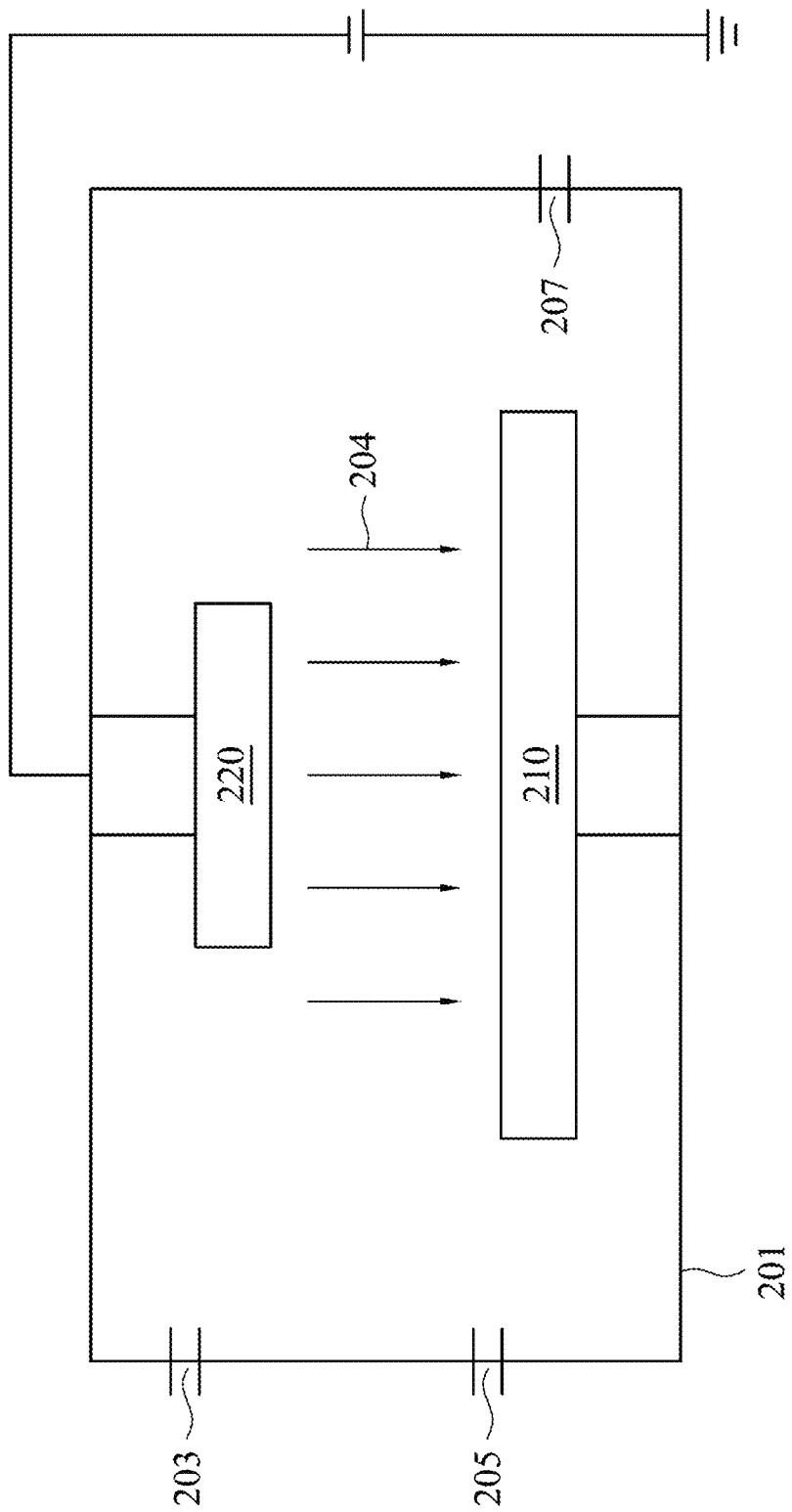
Figure 2D:
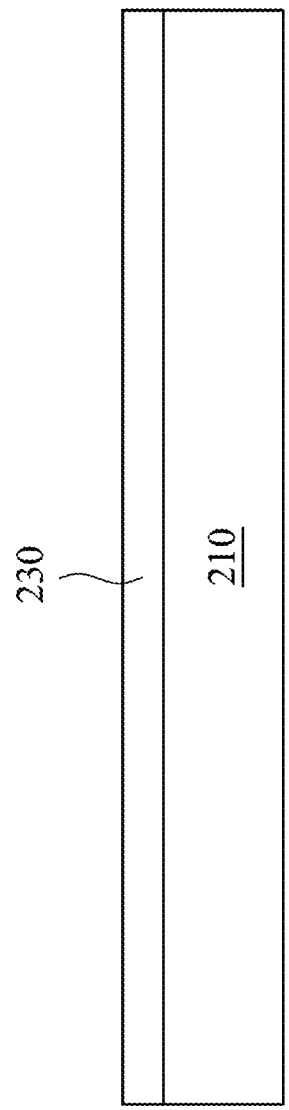

In an operation 150, a sputtering operation 204 is performed, as shown in FIG. 2C. In the sputtering operation 204, a noble gas (e.g., argon) is introduced from the first gas inlet 203 and nitrogen gas is introduced from a second gas inlet 205, so as to bombard a pure titanium target 220 and deposit a single-layered titanium oxynitride film 230 on the metal substrate 210, as shown in FIG. 2D.

In some embodiments, a gas mixture is formed by the nitrogen gas and the noble gas, and a volume of the nitrogen gas is 1.5% to 35% of a volume of the gas mixture. When the volume of the nitrogen gas is not in such range, whether the volume of the nitrogen gas is greater than 35% or smaller than 1.5%, the molar ratio of nitrogen to oxygen of the single-layered titanium oxynitride film decreases and the predetermined color cannot be formed. In some embodiments, the sputtering operation is performed in a fixed sputtering power and the volume of the nitrogen gas in the gas mixture is in the predetermined range of the present invention, and the predetermined color of the single-layered titanium oxynitride film tends to be a color in a first quadrant and a second quadrant in a CIELAB space when the volume of the nitrogen gas in the gas mixture becomes greater. For example, the color may be yellow or green. In other embodiments, when the volume of the nitrogen gas in the gas mixture becomes smaller, the predetermined color of the single-layered titanium oxynitride film tends to be a color in a third quadrant and a fourth quadrant in the CIELAB space. For example, the color tends to be blue or purple.

In some embodiments, the gas mixture causes a working pressure of the sputtering operation 204 in the reaction chamber 201 to be 3 mtorr to 5 mtorr. When the working pressure is lower than 3 mtorr, an average free path of particles in the reaction chamber 201 is too long, such that a sputtering efficiency decreases. On the other hand, when the working pressure is greater than 5 mtorr, excess impurities in the reaction chamber 201 are disadvantageous to the formation of the single-layered titanium oxynitride film.

In some embodiments, the sputtering operation 204 is performed at a temperature of 35° C. to 45° C. The working temperature lower than 35° C. may result in insufficient sputtering efficiency. However, the working temperature greater than 45° C. may cause problems such as a change in a structure of the single-layered titanium oxynitride film or over oxidation. The problems lead to failures in controlling the predetermined color, the luster and/or the flatness of a surface of the single-layered titanium oxynitride film.

In some embodiments, the sputtering power of the sputtering operation 204 is 150 W to 350 W. When the sputtering power is lower than 150 W, the sputtering efficiency is insufficient because insufficient reactivity between the nitrogen gas and titanium, or the single-layered titanium oxynitride film having a predetermined molar ratio of nitrogen to oxygen cannot be formed. On the other hand, when the sputtering power is greater than 350 W, the working temperature of the sputtering operation 204 increases, and drawbacks caused by a too high working temperature which is described before may occur. In some embodiments, the sputtering power of the sputtering operation 204 is in the predetermined range of the present invention, and the predetermined color of the single-layered titanium oxynitride film tends to be the color in the first quadrant and the second quadrant in the CIELAB space when the sputtering power continually decreases (e.g., equal to or smaller than 250 W). For example, the color may be yellow or green. In other embodiments, when the power continually increases (e.g., greater than 250 W), the predetermined color of the single-layered titanium oxynitride film tends to be the color in the third quadrant and the fourth quadrant in the CIELAB space. For example, the color tends to be blue or purple.

In some embodiments, the sputtering operation 204 is performed for 10 minutes to 40 minutes. When the sputtering operation 204 is performed for less than 10 minutes, the single-layered titanium oxynitride film having a predetermined thickness cannot be formed, and the predetermined color may be affected. However, when the sputtering operation 204 is performed for more than 40 minutes, the thickness of the single-layered titanium oxynitride film is so thick that the predetermined color is also affected. Furthermore, the sputtering operation 204 performed for more than 40 minutes may result in increase of the working temperature, and the drawbacks resulted from the too high working temperature may occur.

In some embodiments, the sputtering operation 204 may be, for example, a reactive radio frequency magnetron sputtering operation or a direct current magnetron sputtering operation.

In some embodiments, the thickness of the single-layered titanium oxynitride color film may be 160 nm to 250 nm. Particularly, by using the method of the present invention, merely a small change in the thickness of the color film can form the color film having any desired color in a visible light interval from yellow to purple.

In some embodiments, the single-layered titanium oxynitride color film formed by the method of the present invention may have the molar ratio of nitrogen to oxygen in a range from 0.03 to 0.2. In some embodiments, the molar ratio becomes greater as the sputtering power continually increases. In other embodiments, the molar ratio becomes greater as the volume of the nitrogen gas in the gas mixture continually decreases. In other words, the predetermined color of the single-layered titanium oxynitride color film tends to be the color in the third quadrant and the fourth quadrant in the CIELAB space as the molar ratio becomes greater. For example, the color tends to be blue or purple. In contrast, the predetermined color of the single-layered titanium oxynitride color film tends to be the color in the first quadrant and the second quadrant in the CIELAB space as the molar ratio becomes smaller. For example, the color tends to be yellow or green. The term of "molar ratio" represents a numerical value of a number of nitrogen atoms divided by a number of oxygen atoms (N/O) in the single-layered titanium oxynitride film 230.

In some embodiments, the single-layered titanium oxynitride film 230 includes a composite composition of titanium nitride and titanium oxide. In some examples, the single-layered titanium oxynitride film 230 includes crystal structures of titanium nitride. In some examples, a crystal orientation of the crystal structures includes TiN(111), TiN(200) and/or TiN(100).

In some embodiments, the method of forming the color film and the color film may be applied to decorative colors of constructional materials, furniture, metallic accessories, sheet metals of vehicles, home appliances or any other electronic devices.

Several examples are shown for explaining implementation of the method of forming the color film of the present invention.

Example 1

First, an aluminum substrate was polished, such that a surface of the aluminum substrate was covered by a dense and flat oxide layer. Then, the polished aluminum substrate was washed by acetone. Next, the aluminum substrate was immersed in ethanol, followed by washing the aluminum substrate using deionized water. The washed aluminum substrate was dried by the bake operation, and then was disposed in a reaction chamber of reactive radio frequency magnetron sputtering system. Argon gas was introduced into the reaction chamber, so as to clean the reaction chamber. Thereafter, the back pressure of the reaction chamber was reduced to $6 \times 10^{-6}$ torr, and then the sputtering operation was performed. The sputtering operation was performed under the following process parameters: a flowrate of the argon gas of 30 sccm; a flowrate of nitrogen gas of 5 sccm; a working pressure of 5 mtorr; a reaction time of 30 minutes; a reaction temperature of 35° C. to 45° C.; and, a sputtering power of 150 W. A thickness, adhesivity, visible light reflectivity, a color and the molar ratio of nitrogen to oxygen of the single-layered titanium oxynitride film of Example 1 are shown in Table 1, FIG. 3 through FIG. 5 and FIG. 7.

Examples 2 to 5

Examples 2 to 5 were performed by the same method as Example 1, while the sputtering power used in Examples 2 to 5 was changed. The sputtering power, thicknesses, adhesivity, visible light reflectivity, colors and the molar ratio of nitrogen to oxygen of the single-layered titanium oxynitride films of Examples 2 to 5 are shown in Table 1, FIG. 3 through FIG. 5 and FIG. 7. In addition, FIG. 6A through FIG. 6C are electron microscope images showing surface roughness of Examples 2 to 4.

TABLE 1

| Example | 1 | 2 | 3 | 4 | 5 |
| --- | --- | --- | --- | --- | --- |
| Sputtering power (W) | 150 | 200 | 250 | 300 | 350 |
| Thickness (nm) | 161 | 203 | 210 | 235 | 246 |
| Adhesivity | 5B | 4B | 5B | 5B | 4B |
| CIEL*a*b coordinate | (37.43, −2.04, 1.31) | (37.59, −2.82, 1.48) | (37.61, 2.66, 2.13) | (39.44, 10.27, −8.51) | (39.34, 14.64, −10.13) |

Example 6

Figure 8A:
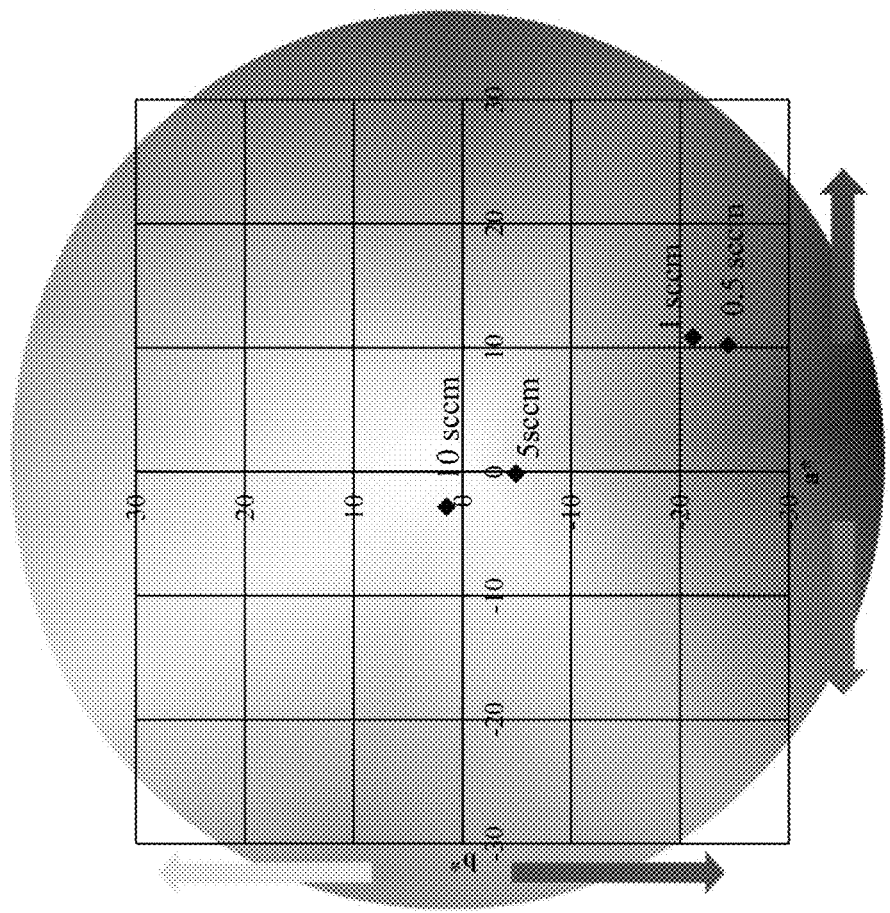
FIG. 8A and FIG. 8B are CIELAB color space diagrams showing colors of single-layered titanium oxynitride films of Example 6 and Example 7.
Figure 9:
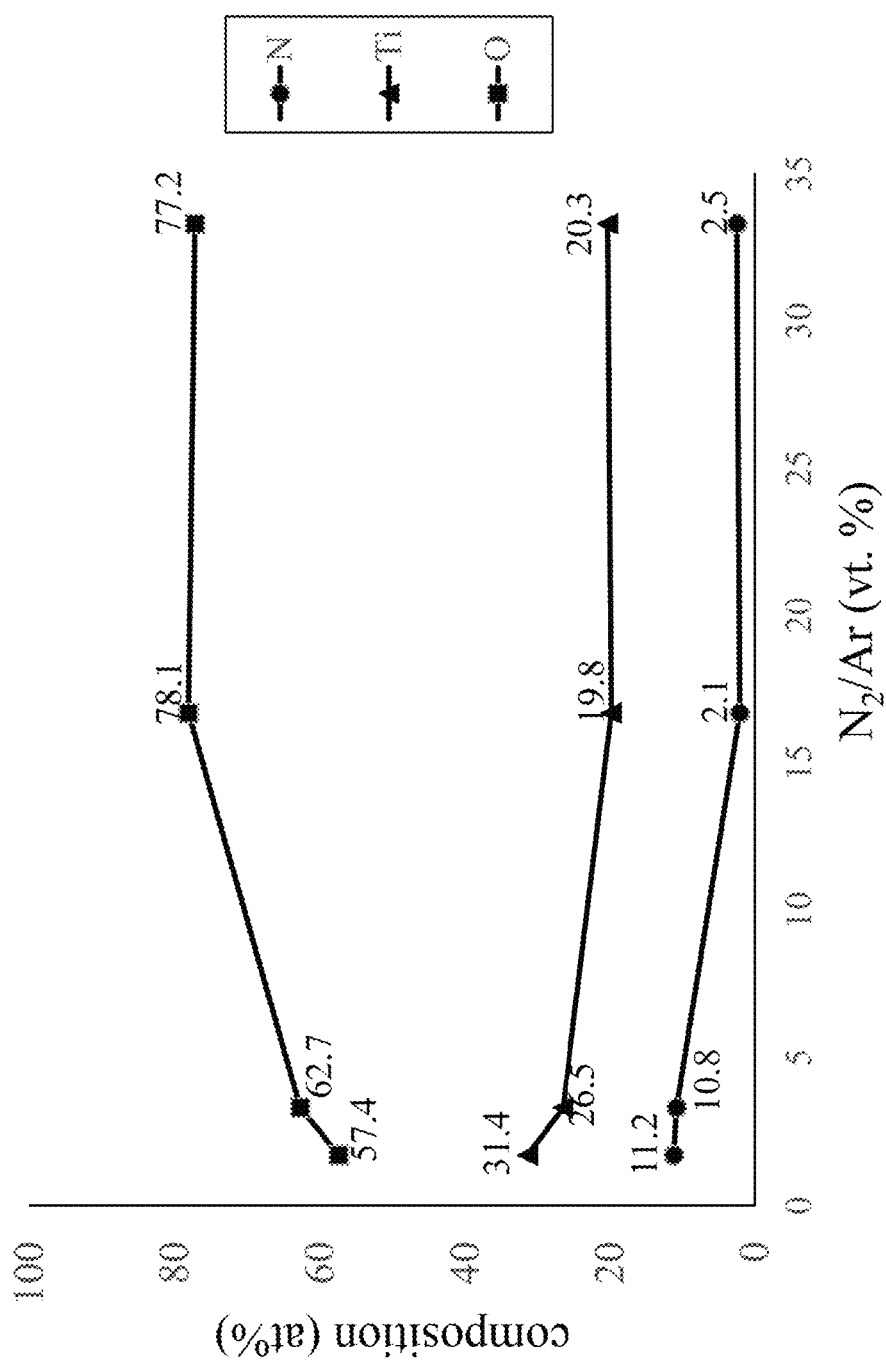
FIG. 9 is a line chart showing a molar ratio of nitrogen to oxygen of a single-layered titanium oxynitride film of Example 6.

Example 6 was performed by the same method as Example 1, while the sputtering power was fixed at 200 W, and the flowrate of the nitrogen gas was adjusted to 0.5 sccm, 1 sccm, 5 sccm, and 10 sccm, in order to observe an effect on the color and the molar ratio of the single-layered titanium oxynitride film caused by different flowrates of the nitrogen gas. Other process parameters of Example 6 were same as those of Example 1, and might not be repeated herein. The color and the molar ratio of nitrogen to oxygen of Example 6 are shown in FIG. 8A and FIG. 9.

Example 7

Figure 8B:
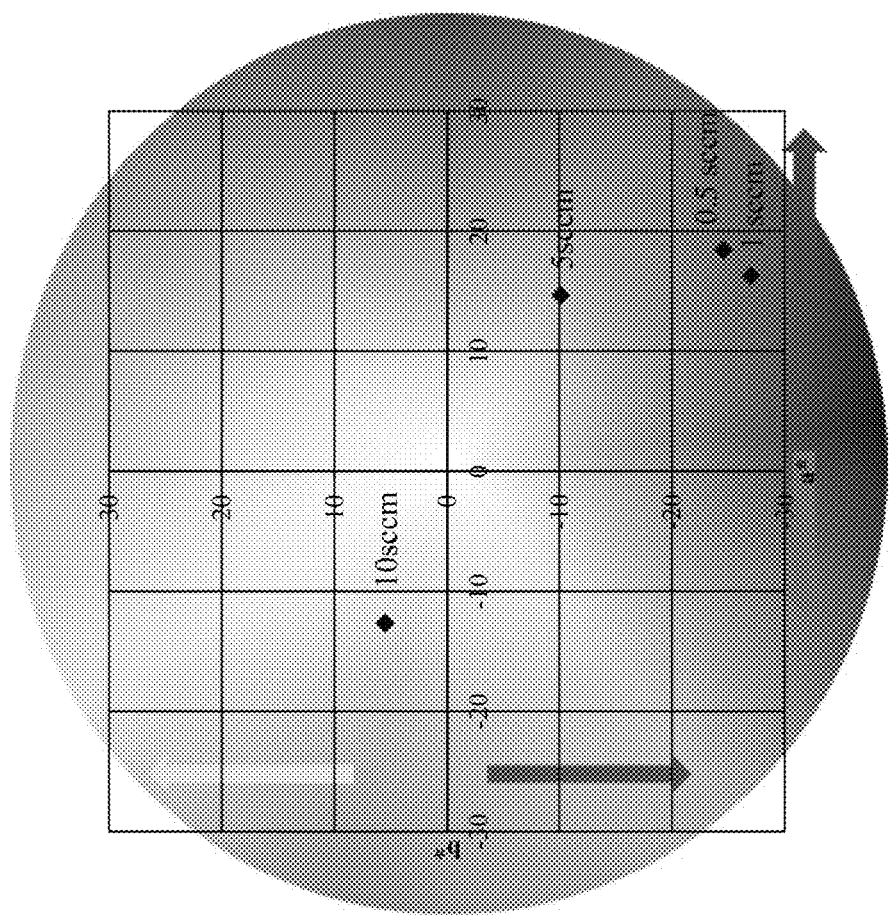

Example 7 was performed by the same method as Example 6, while the sputtering power was fixed at 350 W. Other process parameters of Example 7 were same as those of Example 6, and might not be repeated herein. The color and the molar ratio of nitrogen to oxygen of Example 7 are shown in FIG. 8B and FIG. 9.

A test of the adhesivity of the present invention is performed according to a standard test method of ASTMD 3359-97. Briefly speaking, the single-layered titanium oxynitride film on the aluminum substrate was cut into 6 to 7 squares in each row and each column, and these squares were detached by a tape to observe a detaching level of the squares. The detaching level of the squares was classified into the following criteria for an evaluation of the adhesivity.
5B: The edges of the squares are completely smooth; none of the squares is detached.
4B: Small flakes of the film are detached at intersections; less than 5% of the area is affected.
3B: Small flakes of the film are detached at intersections of squares. The area affected is 5 to 15% of the film.
2B: The film has flaked along the edges and on parts of the squares. The area affected is 15 to 35% of the film.
1B: The film has flaked along the edges of squares in large ribbons and whole squares have detached. The area affected is 35 to 65% of the film.
0B: Flaking and detachment worse than Grade 1B.

Figure 3:
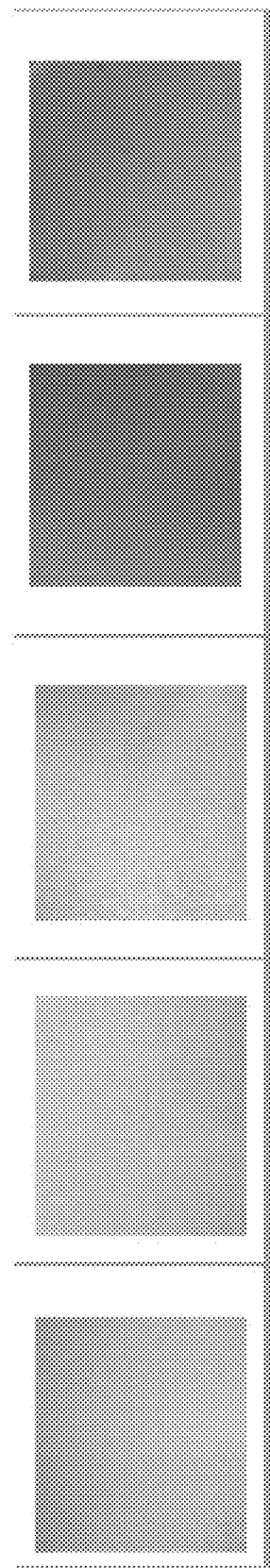
FIG. 3 is a photo showing colors of single-layered titanium oxynitride films of Examples 1 to 5 each of which is disposed on an aluminum substrate.
Figure 4:
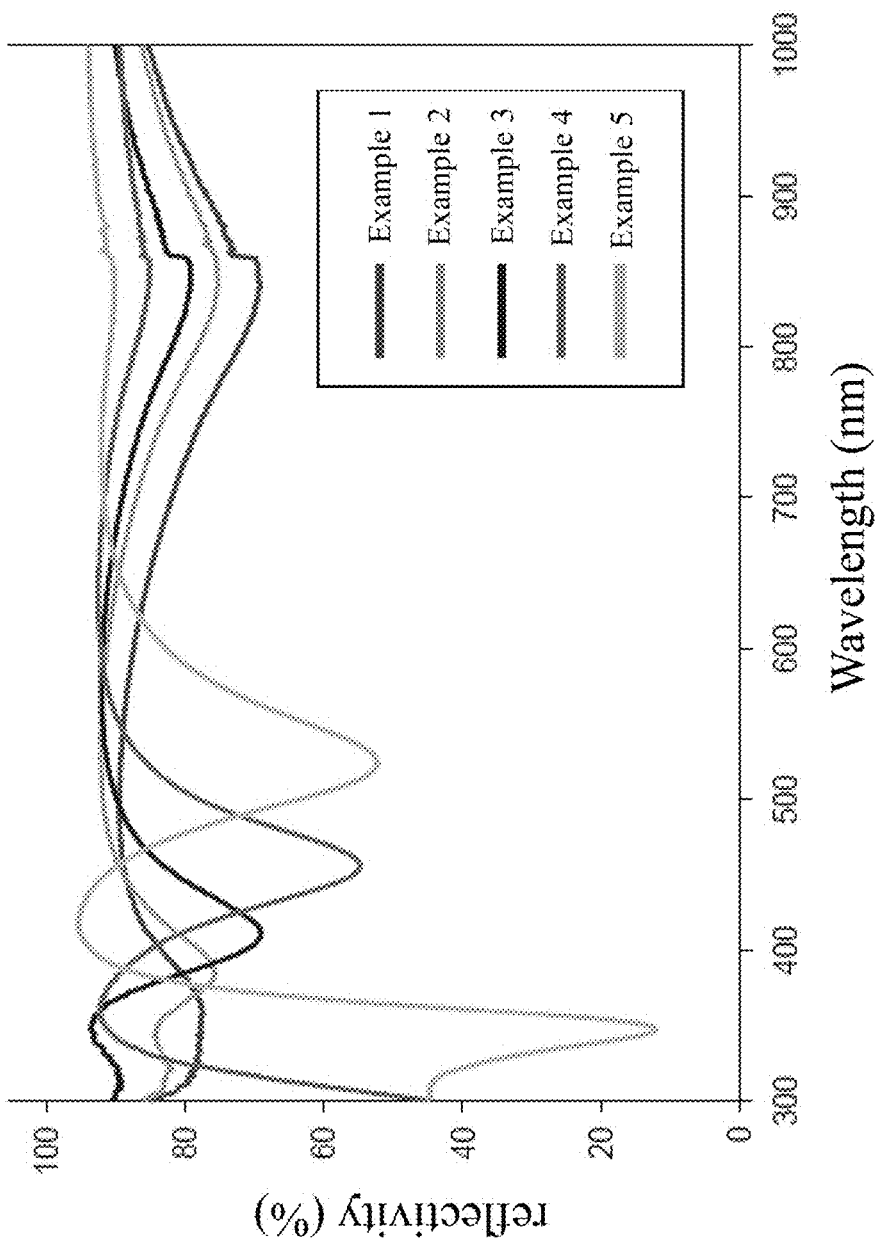
FIG. 4 shows visible light reflectivity of single-layered titanium oxynitride films of Examples 1 to 5 each of which is disposed on an aluminum substrate, in which the reflectivity is detected by using an UV-visible spectroscopy.
Figure 5:
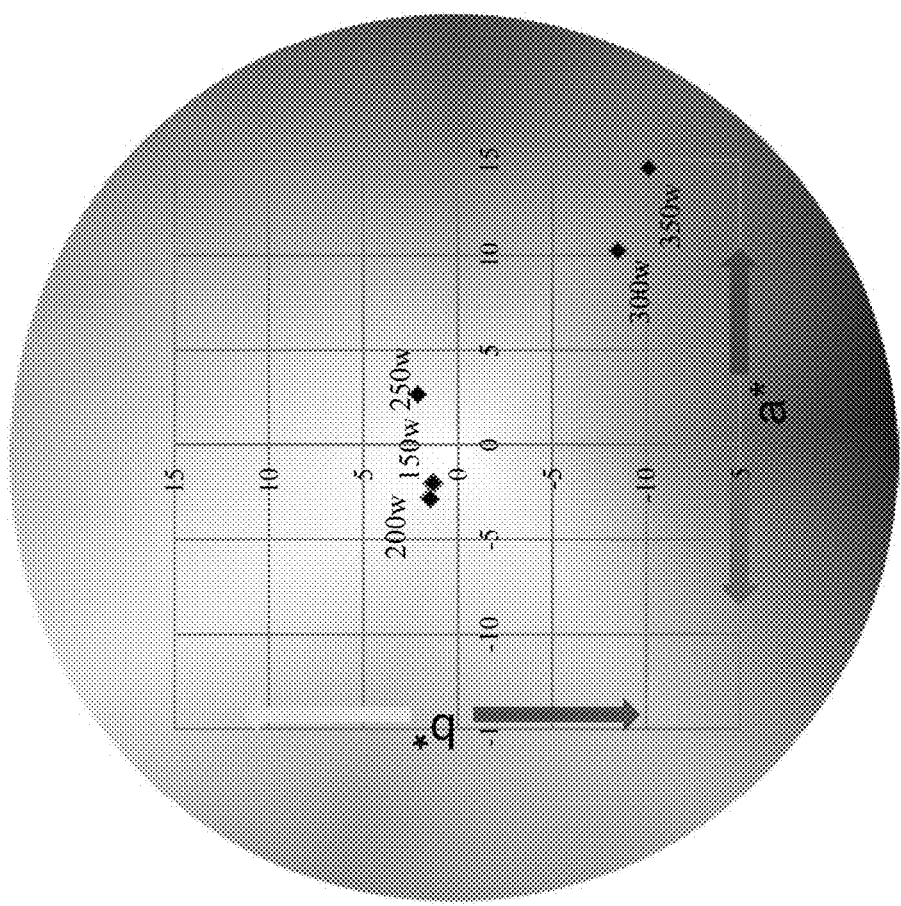
FIG. 5 is a CIELAB color space diagram showing colors of single-layered titanium oxynitride films of Examples 1 to 5 each of which is disposed on an aluminum substrate.
Figure 6A:
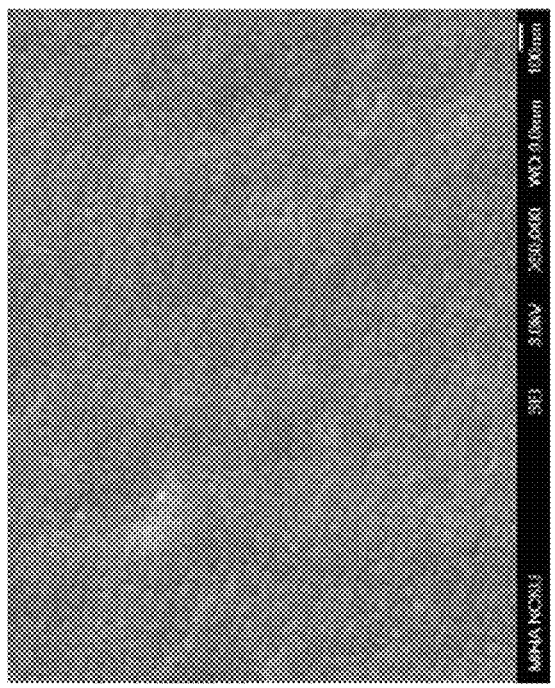
FIG. 6A through FIG. 6C are electron microscope images showing surface roughness of Examples 2 to 4 of the present invention.
Figure 6B:
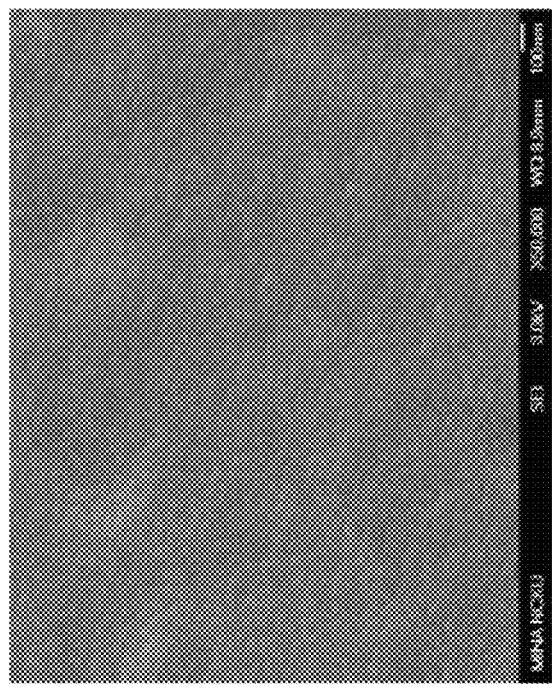
Figure 6C:
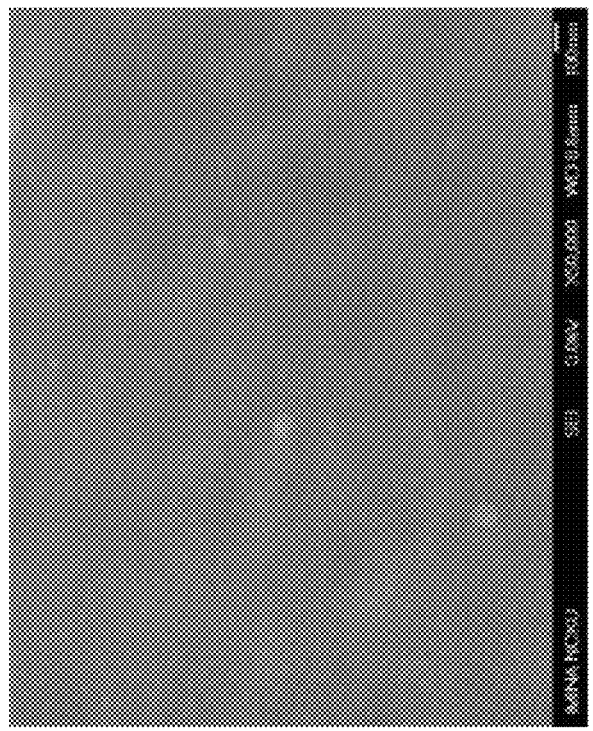

Please refer to Table 1 and FIG. 3 through FIG. 5. FIG. 3 is a photo showing colors of single-layered titanium oxynitride films of Examples 1 to 5 each of which is disposed on an aluminum substrate. FIG. 4 shows visible light reflectivity of single-layered titanium oxynitride films of Examples 1 to 5 each of which is disposed on an aluminum substrate, in which the reflectivity is detected by using an UV-visible spectroscopy. FIG. 5 is a CIELAB color space diagram showing colors of single-layered titanium oxynitride films of Examples 1 to 5 each of which is disposed on an aluminum substrate.

As shown in Table 1 and FIG. 3 through FIG. 5, within the same sputtering time, the single-layered titanium oxynitride film is thicker and the color of the film tends to be the color in the third quadrant and the fourth quadrant in the CIELAB space when the sputtering power gets greater. In contrast, within the same sputtering time, the single-layered titanium oxynitride film becomes thinner and the color of the film tends to be the color in the first quadrant and the second quadrant in the CIELAB space when the sputtering power gets smaller.

Furthermore, the colors of the single-layered titanium oxynitride films of Example 1 to 5 may tend to be the color in the second quadrant or the fourth quadrant in the CIELAN space, which may be controlled by the sputtering power.

In addition, as shown in Table 1, the single-layered titanium oxynitride film formed by the method of the present invention has sufficient adhesivity to the aluminum substrate. According to FIG. 6A through FIG. 6C, the surface of the single-layered titanium oxynitride film is more flat when the greater sputtering power is applied.

Figure 7:
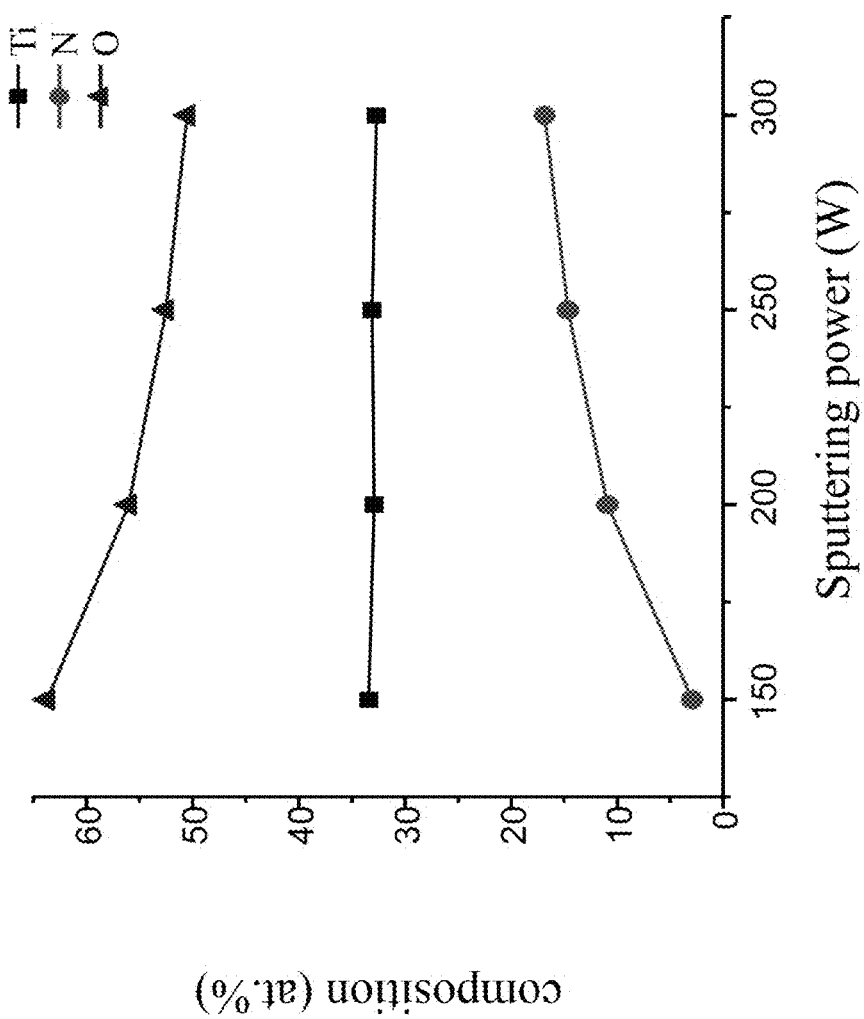
FIG. 7 is a line chart showing molar ratios of nitrogen to oxygen of single-layered titanium oxynitride films of Examples 1 to 4.

Please refer to FIG. 7. FIG. 7 is a line chart showing molar ratios of nitrogen to oxygen of single-layered titanium oxynitride films of Examples 1 to 4. According to FIG. 7, the single-layered titanium oxynitride film having higher nitrogen content can be obtained by using the greater sputtering power, and the color of the film tends to be blue or purple.

FIG. 8A is a CIELAB color space diagram showing a color of a single-layered titanium oxynitride film of Example 6. FIG. 8B is a CIELAB color space diagram showing a color of a single-layered titanium oxynitride film of Example 7. FIG. 9 is a line chart showing a molar ratio of nitrogen to oxygen of a single-layered titanium oxynitride film of Example 6.

As shown in FIG. 8A and FIG. 8B, the color tends to be blue or purple when the volume of the nitrogen gas in the gas mixture is smaller. In contrast, the color tends to be yellow or green when the volume of the nitrogen gas in the gas mixture is greater. Furthermore, the molar ratio of nitrogen to oxygen of the single-layered titanium oxynitride film becomes greater (i.e., the greater nitrogen content) when the volume of the nitrogen gas in the gas mixture is smaller.

By adjusting the flowrate of the nitrogen gas, the working pressure, the sputtering power and the sputtering time, the single-layered titanium oxynitride color films may have different colors in a particular range of the thickness. The film can have metallic luster, satisfactory adhesivity and flat surface.

Although the present invention has been described in considerable detail with reference to certain embodiments thereof, while it is not intended to limit the present invention. It will be apparent to those skilled in the art that various modifications and variations can be made to the structure of the present invention without departing from the scope or spirit of the invention. Therefore, the spirit and scope of the appended claims should not be limited to the description of the embodiments contained herein.

What is claimed is:

1. A method of forming a color film, comprising:
providing a metal substrate; and
performing a sputtering operation on the metal substrate in a reaction chamber, so as to form a single-layered titanium oxynitride film having a predetermined color over the metal substrate, wherein a back pressure of the reaction chamber is $5\times10^{-6}$ torr to $8\times10^{-6}$ torr before the sputtering operation is performed, and the sputtering operation comprises:
bombarding a titanium target with a gas mixture containing a noble gas and a nitrogen gas using a sputtering power of 150 W to 350 W, wherein a volume of the nitrogen gas is 1.5% to 35% of a volume of the gas mixture, and the sputtering operation excludes an operation of introducing oxygen gas.

2. The method of claim 1, wherein the sputtering operation is performed for 10 minutes to 40 minutes.

3. The method of claim 1, wherein the sputtering operation is performed under a temperature of 35° C. to 45° C.

4. The method of claim 1, wherein the sputtering operation is performed under a working pressure of 3 mtorr to 5 mtorr.

5. The method of claim 1, wherein when the sputtering power is equal to or smaller than 250 W, the predetermined color tends to be a color in a first quadrant and a second quadrant in a CIELAB space.

6. The method of claim 1, wherein when the sputtering power is greater than 250 W, the predetermined color tends to be a color in a third quadrant and a fourth quadrant in a CIELAB space.

* * * * *